United States Patent [19]

McClaskey

[11] 3,723,899

[45] Mar. 27, 1973

[54] MULTIPLE OSCILLATOR ISOLATION CIRCUIT

[75] Inventor: Boyd M. McClaskey, Flourtown, Pa.

[73] Assignee: Narco Scientific Industries, Inc., Fort Washington, Pa.

[22] Filed: Jan. 6, 1972

[21] Appl. No.: 215,865

[52] U.S. Cl. .......................331/49, 307/80, 307/243, 328/104, 331/116 R, 333/7

[51] Int. Cl. ..........................H03b 3/00, H03k 17/76

[58] Field of Search ........331/49; 307/64, 65, 80, 81, 307/243; 328/104; 333/7

[56] References Cited

UNITED STATES PATENTS 3,226,648 12/1965 Davidson...........................331/49 X 3,533,019 10/1970 Knirsch.............................331/49 X

*Primary Examiner*—Roy Lake

*Assistant Examiner*—Siegfried H. Grimm

*Attorney*—Henry N. Paul, Jr. et al.

[57] ABSTRACT

A multiple oscillator isolation circuit for driving one of such oscillators at a time, switchably connecting the output of said driven oscillator to a common buss, and isolating such driven oscillator from all the other oscillators. Each oscillator contains an active device which is connected to a control line of an IC gate, and which is in series connection with the oscillator output and an input leg of a diode gate which drives the buss, such that the energized control line both drives the oscillator and gates the oscillator output through to the common buss.

11 Claims, 1 Drawing Figure

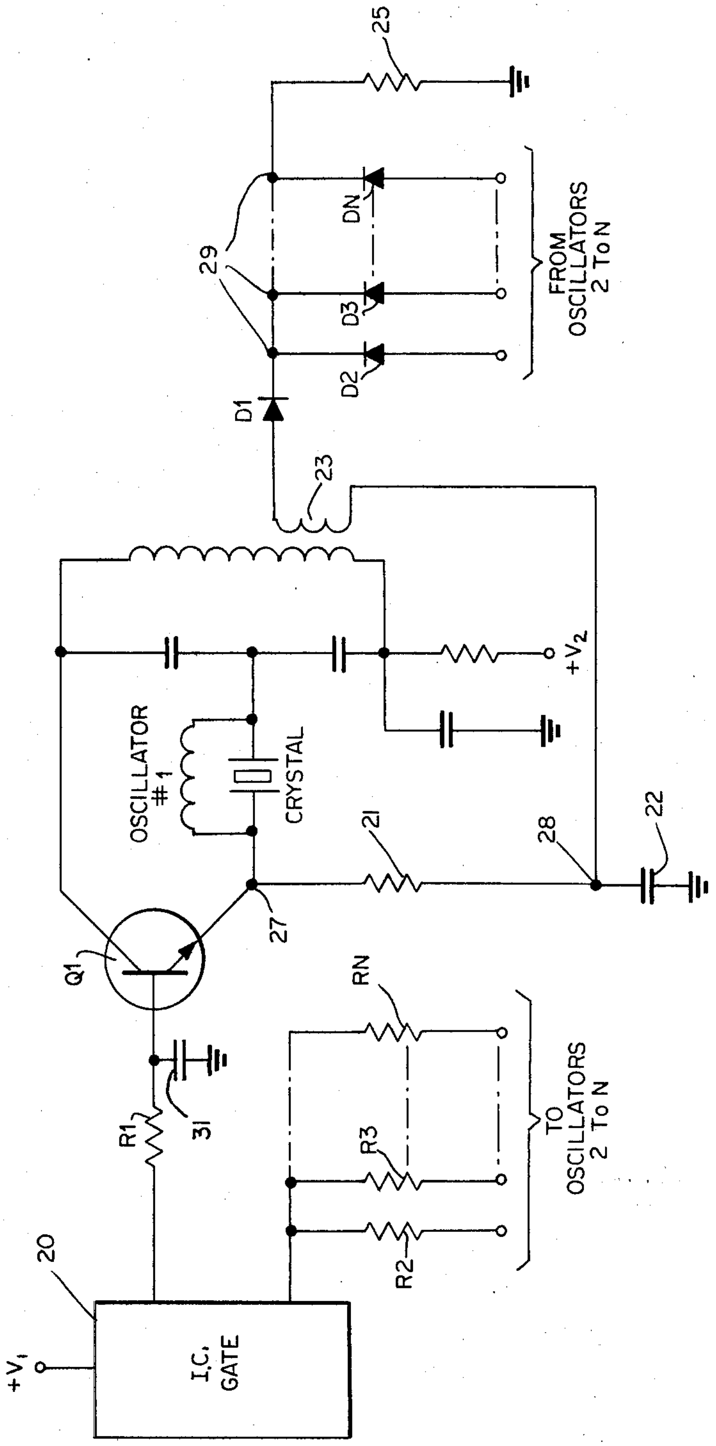
I.C. GATE
+V1
20
R1
31
Q1
27
OSCILLATOR #1
CRYSTAL
21
28
22
+V2
23
D1
D2
D3
DN
29
25
FROM OSCILLATORS 2 To N
TO OSCILLATORS 2 To N
R2
R3
RN

MULTIPLE OSCILLATOR ISOLATION CIRCUIT

BACKGROUND OF THE INVENTION

1. Field of the Invention

This invention lies in the field of oscillator isolation circuits and, more particularly, isolation circuits for connecting a plurality of oscillator outputs to a common buss.

2. Description of the Prior Art

In many electronics applications, and particularly in aircraft radio systems, the need arises to have multiple (two or more) oscillators which are connected to and drive a common buss, or common output load. Thus, in a typical radio transceiver, there is found a plurality of crystal oscillators, for deriving different carrier frequencies and/or different mixer frequencies, the outputs of which are to be connected through to a common buss or channel. It is highly desirable to be able to gate such oscillators on and off automatically, as through a solid state gate or logic network, as opposed to switching such oscillators into and out of the circuit by make-break switches. For such an application, it is necessary to have the output of each such oscillator connected directly to the buss, or common point, when the frequency of such oscillator is called for, but isolated from the buss and from all such other oscillators when the frequency of some other oscillator is called for. While this function can be accomplished through elaborate logic circuitry, what is desired in the art is a simple isolation circuit which permits connection of the multiple oscillator outputs to a common buss while maintaining isolation between the oscillator circuits when only one oscillator is on at a time, and with a single control signal functioning to both turn on the chosen oscillator and connect it to the common buss.

SUMMARY OF THE INVENTION

In accordance with the above-noted need in the art, there is provided an oscillator isolation circuit connecting the output of each of a plurality of oscillators through a switch diode to a common point, each of such oscillators having an active device controlled by an output from a logic circuit, the active device being direct connected in series with the oscillator output and its associated switch diode so as to forward bias such diode when the oscillator is turned on. The active device generates a DC signal which forward biases the switch diode of the operating oscillator and back biases the switch diodes of the non-operating oscillators, so as to maintain isolation of the operating oscillator from the non-operating oscillators.

BRIEF DESCRIPTION OF THE DRAWINGS

The single FIGURE presents a circuit diagram of the isolation circuit of this invention, indicating inputs to and outputs from a plurality of oscillators.

DESCRIPTION OF THE PREFERRED EMBODIMENT

Referring now to the drawing, there is illustrated an oscillator, designated as oscillator No. 1, controlled by a control signal from IC gate 20 which is transmitted through resistor R1. Gate 20, having inputs not shown, is a conventional commercially available IC gate designed to provide an output signal on one of N outputs at a time, said N outputs being connected to resistors R1 through RN respectively. In the drawing, a conventional crystal version of a Colpitts oscillator, having a transistor Q1 as its active device, is shown. The operation of this form of oscillator is sufficiently well known in the art that it is not necessary to discuss the various components thereof. The base of Q1 is connected to resistor R1, and is also by-passed to ground for RF frequencies by capacitor 31. The oscillator is driven to oscillation when a signal is coupled through R1. Similarly, oscillators 2 through N, not shown, are connected to and driven through resistors R2 through RN.

Oscillators 2 through N are of the same design, and driven by the IC gate in the same manner as oscillator 1 which is illustrated in the drawing.

Oscillator 1 operates in a well known manner, with its frequency maintained within narrow limits by the resonant frequency of its crystal. When gate 20 provides a signal through resistor R1 to the base of transistor Q1, the transistor is forward biased and the oscillator is turned on, quickly achieving stabilized steady state condition. When no output is connected through to R1, transistor Q1 is held in an off condition, and the oscillator provides no output. Similarly, each of the N oscillators in the overall system is normally held off, and is driven on only in response to a signal from gate 20. This arrangement, whereby only that oscillator producing the selected frequency is running, aids in reduction of stray pick-up of unwanted frequencies.

The emitter of Q1 is connected to terminal 27, which in turn is connected to ground through resistor 21 and capacitor 22. Capacitor 22 is chosen of a value to provide an effective short circuit at the oscillator frequency. Thus, at terminal 28, where resistor 21 and capacitor 22 are connected, there appears a signal which has no appreciable RF, or oscillator frequency component, and which has a DC level which is appreciably that provided by the gate 20 and amplified through Q1. With respect to such DC level, it is noted that Q1 acts as an emitter follower, providing a greater signal than that available from the gate 20.

The output of the oscillator appears across secondary 23, which is connected at one end to terminal 28, and at the other end to a diode D1. The outputs from oscillators 2 through N, which oscillators have identical output circuits, are connected to the input terminals of diodes D2 through DN respectively. The output terminals of diodes D1 through DN are connected at common terminal 29, which in turn is connected to the common buss as designated by load resistor 25. The N diodes are suitably RF switch diodes having a low forward resistance to RF (less than one ohm), but appreciable back resistance, such as the BA 143, made by IT&T.

In practice, when a signal is coupled from gate 20 to any one of the N oscillators, that oscillator is turned on and provides an RF output across its output coil 23. Simultaneously, the gate signal is amplified through the emitter follower action of the oscillator transistor and appears at terminal 28, thus adding to the RF signal across coil 23. The amplified gate signal forward biases the switch diode, and simultaneously back biases the diodes corresponding to all of the other non-driven oscillators. Since only one oscillator is driven at a time from gate 20, only the diode in the output circuit of such driven oscillator will be forward biased and all the other diodes will be back biased. The back biased diodes provide excellent isolation, and effectively disconnect the driven oscillator from all the others.

From the above description it is seen that the circuit of this invention provides an efficient manner of maintaining isolation among a plurality of oscillators having their outputs connected to a common point. Further, such isolation is achieved with a minimum of components. A single IC gate circuit, or equivalent, both controls the selection of the operating oscillator and, through the oscillator active device, actuates isolation of the non-operating oscillators. Thus, for each oscillator one low current control line from the gate provides a signal which functions to both turn on the oscillator and isolate the other oscillators. By contrast, if it were desired to gate respective outputs of the oscillators through a conventional OR circuit, it would be necessary to have a separate driver to actuate the OR circuit, since the output of a conventional IC gate would not have sufficient drive to both drive the oscillator and separately actuate the OR circuit. Thus, the circuit of this invention provides for combined efficient logical selection and isolation of a plurality of oscillators, and achieves these functions with a minimum of components.

It is readily understood by those familiar with the art that the invention is not limited to the precise circuit as illustrated. Thus, while a form of crystal controlled oscillator has been illustrated, the circuit is adapted to be used with free running, or non-crystal oscillators. Further, it is noted that the isolation diodes need not be directly connected to the oscillator outputs. Thus, for example, the output of each oscillator may be coupled to a tuned RF amplifier, with the outputs of each such tuned amplifier being connected to a respective isolation diode. Similarly, while the oscillator selection logic has been illustrated as provided by an IC gate, it is understood that any equivalent logic network may be used for this purpose within the frame of the invention.

I claim:

1. A multiple oscillator circuit, the outputs of the component oscillators connected to a common point and isolated one from another, comprising:

a. a plurality of oscillators;

b. input gate means, for providing gate signals to said oscillators;

c. coupling means, for coupling said gate signals from respective outputs of said gate means to respective ones of said oscillators;

d. each of said oscillators having an active device adapted to receive a gate signal and generate an isolation signal;

e. each of said oscillators having an output circuit, adapted to provide a summation of said isolation signal and the oscillator output; and f. isolation means, having a plurality of inputs each connected to a respective one of said output circuits, and a single output connected to said common point.

2. The circuit as described in claim 1, wherein said input gate comprises an integrated circuit gate.

3. The circuit as described in claim 1, wherein said coupling means comprises a resistance connected between respective outputs of said input gate and respective active devices of said oscillators.

4. The circuit as described in claim 1, wherein said oscillators are crystal controlled, and each said active device is a transistor.

5. The circuit as described in claim 4, wherein each said output circuit comprises a transformer secondary resistively connected to the emitter of said transistor.

6. The circuit as described in claim 5, wherein said transformer secondary is connected to ground through a capacitance which is a substantial short circuit to the oscillator frequency.

7. The circuit as described in claim 4, wherein said isolation means comprises a plurality of diodes, each of said diodes having a first terminal direct connected to a respective output circuit, and all of said diodes having their other terminalS connected to said common point.

8. A switchable multiple oscillator circuit for driving a common point, comprising:

a. a plurality of oscillators, each adapted to provide a combined signal, said signal having an oscillator frequency component and an isolating signal component; and b. isolation means, having multiple input branches coupled respectively to each of said oscillators, for isolating any one of said oscillators which is running from those of said oscillators which aren't running, said isolation means having an output connected to said common point.

9. The circuit as described in claim 8, comprising input gate means for switchably driving only one of said oscillators at a time.

10. The circuit as described in claim 9, wherein each of said oscillators has an active device resistively connected to an output coupling element, said active device being connected to an output of said gate means and amplifying the signal therefrom to provide said isolating signal component.

11. A switchable multiple channel circuit for driving a common point, comprising:

a. a plurality of RF frequency channels, each adapted to provide a combined signal, said signal having an RF frequency component and an isolating signal component; and b. isolation means, having multiple input branches coupled respectively to each of said channels, for isolating any one of said channels which is producing a signal from those of said channels which aren't producing a signal, said isolation means having an output connected to said common point.

* * * * *